United States Patent
Lee

(10) Patent No.: US 12,142,345 B2
(45) Date of Patent: Nov. 12, 2024

(54) PAGE BUFFER, MEMORY DEVICE HAVING PAGE BUFFER, AND METHOD OF OPERATING MEMORY DEVICE

(71) Applicants: SK hynix Inc., Icheon (KR); Korea Advanced Institute of Science and Technology, Daejeon (KR)

(72) Inventor: Chang Yeop Lee, Daejeon (KR)

(73) Assignees: SK hynix Inc.; Korea Advanced Institute of Science and Technology

( * ) Notice: Subject to any disclaimer, the term of this patent is extended or adjusted under 35 U.S.C. 154(b) by 134 days.

(21) Appl. No.: 17/876,396

(22) Filed: Jul. 28, 2022

(65) Prior Publication Data
US 2023/0230626 A1 Jul. 20, 2023

(30) Foreign Application Priority Data
Jan. 18, 2022 (KR) .......................... 10-2022-0007297

(51) Int. Cl.
*G11C 7/12* (2006.01)
*G11C 7/10* (2006.01)
*G11C 7/14* (2006.01)

(52) U.S. Cl.
CPC .............. *G11C 7/12* (2013.01); *G11C 7/1057* (2013.01); *G11C 7/1069* (2013.01); *G11C 7/14* (2013.01)

(58) Field of Classification Search
None
See application file for complete search history.

(56) References Cited

U.S. PATENT DOCUMENTS

2019/0096479 A1*  3/2019  Yu .......................... G11C 16/26

FOREIGN PATENT DOCUMENTS

| KR | 10-0492780 B1 | 6/2005 |
| KR | 10-1775660 B1 | 9/2017 |
| KR | 10-20190034979 A | 4/2019 |
| KR | 10-20190036285 A | 4/2019 |

OTHER PUBLICATIONS

P. Keranen et al., "256 × TDC Array With Cyclic Interpolators Based on Calibration-Free 2×Time Amplifier", IEEE Transactions on Circuits and Systems—I: Regular Papers, vol. 66, No. 2, Feb. 2019.

* cited by examiner

*Primary Examiner* — Alfredo Bermudez Lozada

(57) ABSTRACT

Provided herein may be a page buffer, a memory device having the page buffer, and a method of operating the memory device. The page buffer may include a precharger configured to precharge a bit line to a precharge level, a comparison signal output circuit configured to generate a first output signal by comparing a voltage of the bit line with a reference voltage, a pulse width control circuit configured to generate a second output signal by increasing a pulse width of a pulse of the first output signal by a preset multiple, and a register configured to sense data based on a pulse width of the second output signal and output the sensed data.

19 Claims, 15 Drawing Sheets

PAGE BUFFER, MEMORY DEVICE HAVING
PAGE BUFFER, AND METHOD OF
OPERATING MEMORY DEVICE

CROSS-REFERENCE TO RELATED
APPLICATION

The present application claims priority under 35 U.S.C. § 119(a) to Korean patent application number 10-2022-0007297, filed on Jan. 18, 2022, in the Korean Intellectual Property Office, the entire disclosure of which is incorporated herein by reference.

BACKGROUND

1. Technical Field

Various embodiments of the present disclosure relate to an electronic device, and more particularly to a page buffer, a memory device having the page buffer, and a method of operating the memory device.

2. Related Art

Memory devices are generally classified as volatile memory devices or nonvolatile memory devices.

A volatile memory device is a memory device in which stored data is lost when power supply is interrupted. Representative examples of the volatile memory device include a static random access memory (SRAM), a dynamic RAM (DRAM), and a synchronous DRAM (SDRAM). A nonvolatile memory device is a memory device in which stored data is retained even when power supply is interrupted. Representative examples of the nonvolatile memory device include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM). Flash memory is roughly classified into a NOR type and a NAND type.

SUMMARY

Various embodiments of the present disclosure are directed to a page buffer that enables a read operation for a plurality of program states to be performed in the state in which one read voltage is applied to a word line during a read operation, a memory device having the page buffer, and a method of operating the memory device.

An embodiment of the present disclosure may provide for a page buffer. The page buffer may include a precharger configured to precharge a bit line to a precharge level, a comparison signal output circuit configured to generate a first output signal by comparing a voltage of the bit line with a reference voltage, a pulse width control circuit configured to generate a second output signal by increasing a pulse width of a pulse of the first output signal by a preset multiple, and a register configured to sense data based on a pulse width of the second output signal and output the sensed data.

An embodiment of the present disclosure may provide for a memory device. The memory device may include a memory block including a plurality of memory cells, each programmed to any one of a plurality of states, the plurality of states including an erased state and a plurality of program states, a voltage generation circuit configured to generate a read voltage to be applied to word lines of the memory block during a read operation, and a read and write circuit coupled to bit lines of the memory block, and configured to sense data based on a discharge slope of the bit lines during the read operation.

An embodiment of the present disclosure may provide for a method of operating a memory device. The method may include applying one read voltage having a certain potential level to a selected word line coupled in common to one or more memory cells, detecting a discharge slope by comparing voltages of respective bit lines coupled to the one or more memory cells with a reference voltage, generating an output signal, a pulse width of which is controlled based on the discharge slope, and sensing data based on the pulse width of the output signal.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Various embodiments of the present disclosure will now be described more fully hereinafter with reference to the accompanying drawings, in which illustrative embodiments of the present disclosure are shown, so that those skilled in the art can easily practice the technical spirit of the present disclosure.

Figure 1:
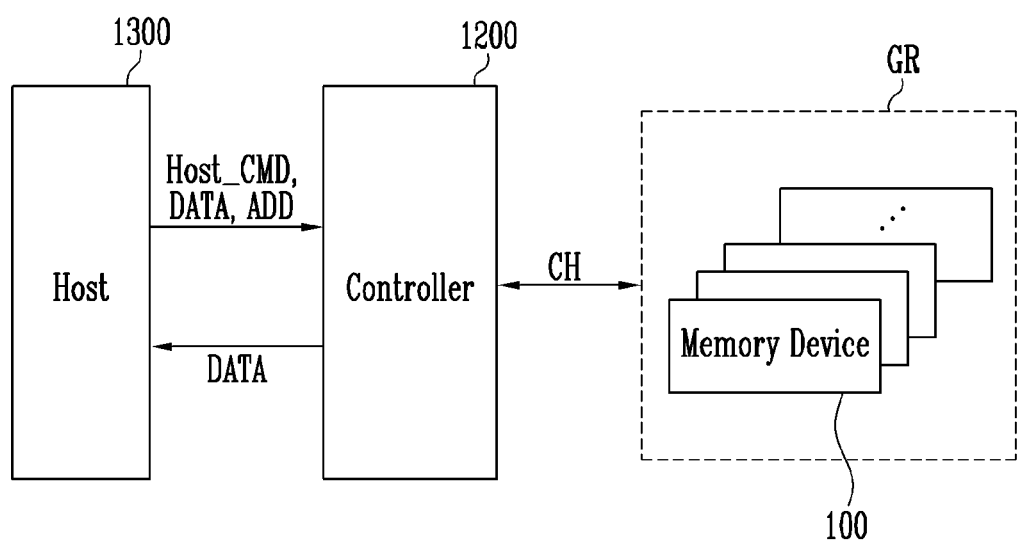
FIG. 1 is a block diagram illustrating a memory system including a memory device according to an embodiment of the present disclosure.

FIG. 1 is a block diagram illustrating a memory system including a memory device according to an embodiment of the present disclosure.

Referring to FIG. 1, a memory system 1000 may include a plurality of memory devices 100, a controller 1200, and a host 1300. The plurality of memory devices 100 may be grouped into at least one group GR. In an embodiment of the present disclosure, although the host 1300 is illustrated and described as being included in the memory system 1000, the memory system 1000 may be configured to include only the controller 1200 and the plurality of memory devices 100, with the host 1300 being disposed outside the memory system 1000.

In FIG. 1, the plurality of memory devices 100 communicate with the controller 1200 through a channel CH. The controller 1200 may control the plurality of memory devices 100 through the channel CH.

The controller 1200 is coupled between the host 1300 and the plurality of memory devices 100. The controller 1200 may access the plurality of memory devices 100 in response to a request from the host 1300. For example, the controller 1200 may control a read operation, a program operation, an erase operation, and a background operation of the plurality of memory devices 100 in response to a host command Host_CMD received from the host 1300. The host 1300 may transmit an address ADD and data to be programmed DATA, together with the host command Host_CMD, during a write operation, and may transmit an address ADD, together with the host command Host_CMD, during a read operation. During a program operation, the controller 1200 may transmit the command corresponding to the program operation and the data to be programmed DATA to the plurality of memory devices 100. During a read operation, the controller 1200 may transmit the command corresponding to the read operation to the plurality of memory devices 100, receive read data DATA from the plurality of memory devices 100, and transmit the received data DATA to the host 1300. The controller 1200 may provide an interface between the plurality of memory devices 100 and the host 1300. The controller 1200 may run firmware for controlling the plurality of memory devices 100.

The host 1300 may include portable electronic devices, such as a computer, a personal digital assistant (PDA), a portable multimedia player (PMP), an MP3 player, a camera, a camcorder, and a mobile phone. The host 1300 may request the program operation, the read operation, and the erase operation of the memory system 1000 through the host command Host_CMD. The host 1300 may transmit the host command Host_CMD corresponding to the program operation, the data DATA, and the address ADD to the controller 1200 so as to perform the program operation of the plurality of memory devices 100, and may transmit the host command Host_CMD corresponding to the read operation and the address ADD to the controller 1200 so as to perform the read operation. Here, the address ADD may be a logical address of the data.

The controller 1200 and the plurality of memory devices 100 may be integrated into a single device. In an illustrative embodiment, the controller 1200 and the plurality of memory devices 100 may be integrated into a single device to form a memory card, such as a personal computer memory card international association (PCMCIA) card, a compact flash (CF) card, a smart media card (SM or SMC), a memory stick, a multimedia card (MMC, RS-MMC, or MMCmicro), an SD card (SD, miniSD, microSD, or SDHC), or a universal flash storage (UFS).

In an embodiment, the memory system 1000 may be provided as one of various elements of an electronic device such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, a radio frequency identification (RFID) device, or one of various elements for forming a computing system.

In an embodiment, the plurality of memory devices 100 or the memory system 1000 may be mounted as various types of packages. For example, the plurality of memory devices 100 or the memory system 1000 may be packaged and mounted in a type such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline integrated circuit (SOIC), shrink small outline package (SSOP), thin small outline (TSOP), system in package (SIP), multi-chip package (MCP), wafer-level fabricated package (WFP), or wafer-level processed stack package (WSP).

Figure 2:
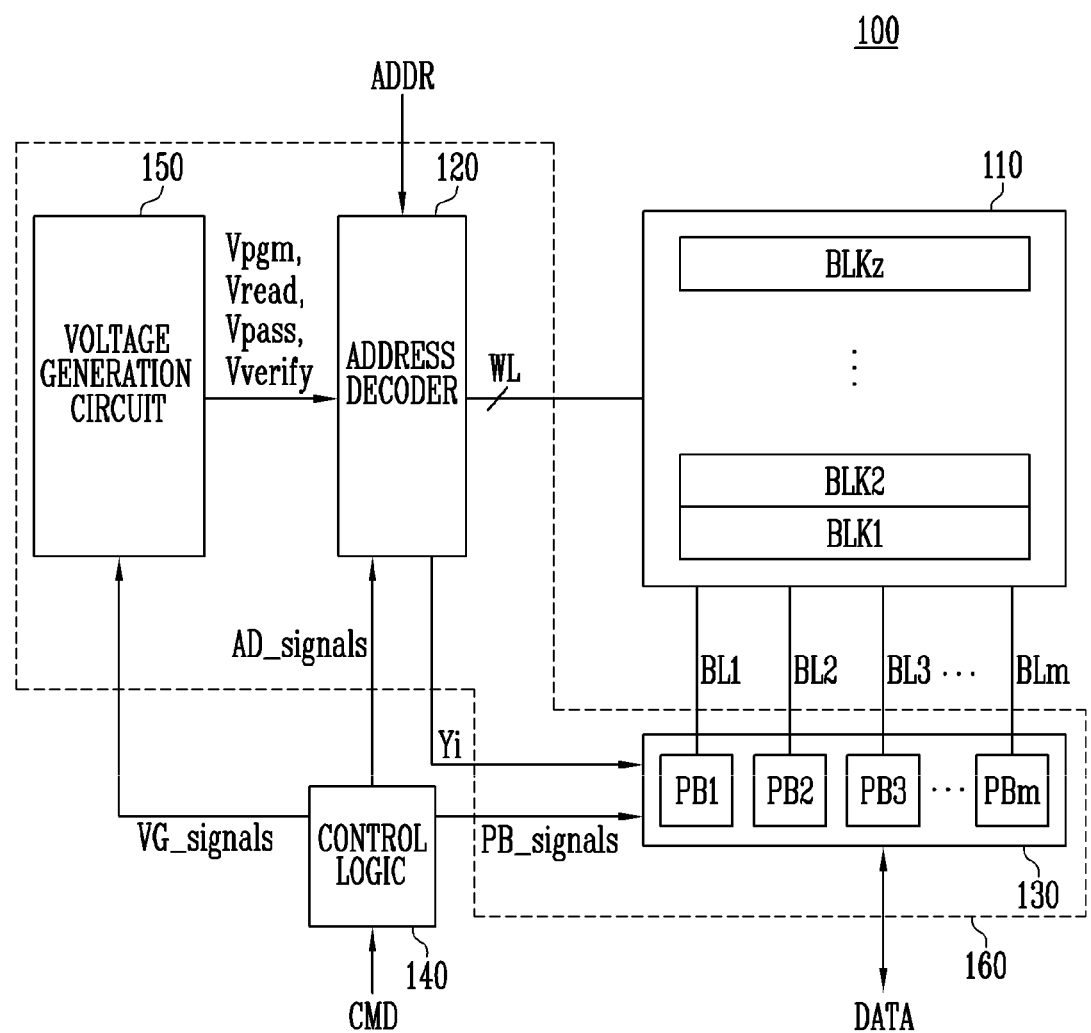
FIG. 2 is a diagram illustrating a memory device of FIG. 1.

FIG. 2 is a diagram illustrating a memory device 100 of FIG. 1.

Referring to FIG. 2, the memory device 100 may include a memory cell array 110, an address decoder 120, a read and write circuit 130, a control logic 140, and a voltage generation circuit 150. The address decoder 120, the read and write circuit 130, and the voltage generation circuit 150 may be defined as a peripheral circuit 160 which performs a read operation on the memory cell array 110.

The memory cell array 110 includes a plurality of memory blocks BLK1 to BLKz. The plurality of memory blocks BLK1 to BLKz are coupled to the address decoder 120 through word lines WL. The memory blocks BLK1 to BLKz are coupled to the read and write circuit 130 through bit lines BL1 to BLm. Each of the memory blocks BLK1 to BLKz may include a plurality of memory cells. In an embodiment, the plurality of memory cells may be nonvolatile memory cells. Memory cells coupled to one word line, among the plurality of memory cells, may be defined as one page. That is, the memory cell array 110 may be composed of a plurality of pages.

Each of the memory blocks BLK1 to BLKz of the memory cell array 110 includes a plurality of memory strings. Each of the memory strings includes a drain select transistor, a plurality of memory cells, and a source select transistor which are coupled in series between the corresponding bit line and a source line. Further, each of the memory strings may include pass transistors between the source select transistor and the memory cells and between the drain select transistor and the memory cells, and may further include a pipe gate transistor between the memory cells. The memory cell array 110 will be described in detail later.

Each of the plurality of memory cells may store a plurality of data bits, as in the case of a multi-level cell (MLC), a triple-level cell (TLC), or a quadruple-level cell (QLC).

The address decoder 120 is coupled to the memory cell array 110 through the word lines WL. The address decoder 120 may be operated in response to address decoder control signals AD_signals generated by the control logic 140. The address decoder 120 receives addresses ADD through an input/output buffer (not illustrated) provided in the memory device 100.

The address decoder 120 may decode a row address, among the received addresses ADD, and may apply a plurality of operating voltages including a program voltage Vpgm, a read voltage Vread, a pass voltage Vpass, and a verify voltage Vverify, which are generated by the voltage generation circuit 150, to the plurality of memory cells of the memory cell array 110 depending on the decoded row address.

The address decoder 120 may decode a column address, among the received addresses ADD. The address decoder 120 may transmit a decoded column address Yi to the read and write circuit 130.

The addresses ADD received in a program operation or a read operation include a block address, a row address, and a column address.

The address decoder 120 may select one memory block and one word line in accordance with the block address and the row address. The column address may be decoded by the address decoder 120, and may then be provided to the read and write circuit 130.

The address decoder 120 may include a block decoder, a row decoder, a column decoder, an address buffer, etc.

The read and write circuit 130 may include a plurality of page buffers PB1 to PBm. The plurality of page buffers PB1 to PBm may be coupled to the memory cell array 110 through the bit lines BL1 to BLm. The plurality of page buffers PB1 to PBm may perform a data sensing operation of sensing the states of memory cells (including an erased state and a plurality of program states) coupled to the bit lines BL1 to BLm during a read operation or a verify operation. During the data sensing operation, each of the plurality of page buffers PB1 to PBm may sense data based on the program state of a selected memory cell coupled to the corresponding bit line. For example, each of the plurality of page buffers PB1 to PBm may detect the time at which the voltage of the bit line coupled to the selected memory cell becomes lower than a reference voltage during the data sensing operation, and may sense data based on the pulse width of an output signal corresponding to the detected time. Here, one read voltage having a constant potential level is applied to a word line coupled to the selected memory cell.

The read and write circuit 130 may be operated in response to page buffer control signals PB_signals output from the control logic 140.

In an embodiment, the read and write circuit 130 may include page buffers (or page registers), a column select circuit, etc.

The control logic 140 may be coupled to the address decoder 120, the read and write circuit 130, and the voltage generation circuit 150. The control logic 140 may receive a command CMD through an input/output buffer (not illustrated) of the memory device 100. The control logic 140 may control the overall operation of the memory device 100 in response to the command CMD. For example, the control logic 140 may receive the command CMD corresponding to the program operation, and may generate and output address decoder control signals AD_signals for controlling the address decoder 120, page buffer control signals PB_signals for controlling the read and write circuit 130, and voltage generation circuit control signals VG_signals for controlling the voltage generation circuit 150 in response to the received command CMD. Further, the control logic 140 may receive the command CMD corresponding to the read operation, and may generate and output address decoder control signals AD_signals for controlling the address decoder 120, page buffer control signals PB_signals for controlling the read and write circuit 130, and voltage generation circuit control signals VG_signals for controlling the voltage generation circuit 150 in response to the received command CMD.

During a program operation, the voltage generation circuit 150 may generate the program voltage Vpgm, the pass voltage Vpass, and the verify voltage Vverify under the control of the voltage generation circuit control signals VG_signals output from the control logic 140, and may output the generated voltages to the address decoder 120. Also, during a read operation, the voltage generation circuit 150 may generate one read voltage Vread and the pass voltage Vpass under the control of the voltage generation circuit control signals VG_signals output from the control logic 140, and may output the generated voltages to the address decoder 120. The one read voltage Vread generated by the voltage generation circuit 150 may be a voltage maintained at a constant potential level. For example, the one read voltage Vread may be a voltage higher than the threshold voltages of the memory cells programmed to the plurality of program states.

Figure 3:
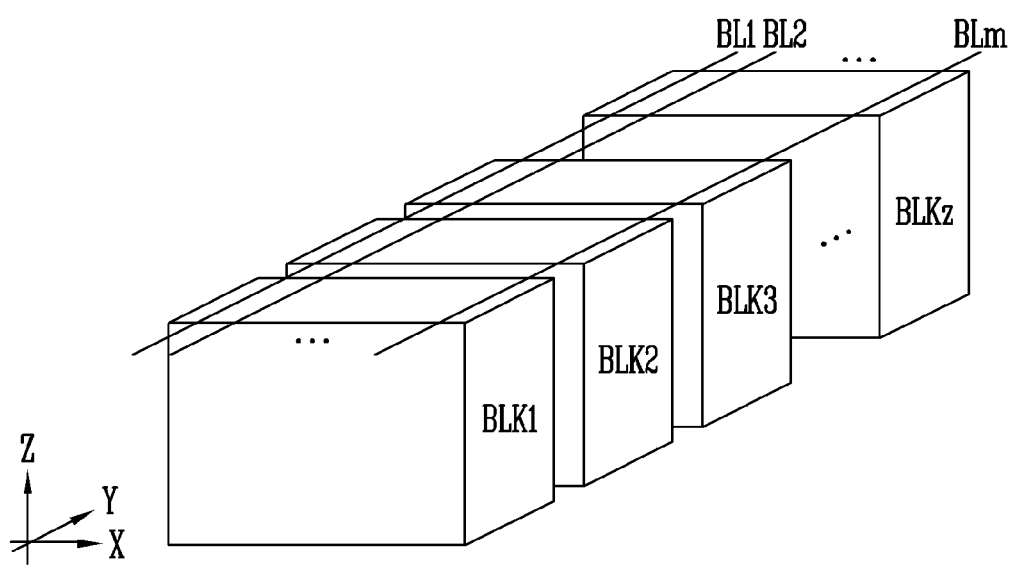
FIG. 3 is a diagram illustrating memory blocks having a 3D structure.

FIG. 3 is a diagram illustrating memory blocks having a 3D structure.

Referring to FIG. 3, the memory blocks BLK1 to BLKz having a 3D structure may be arranged to be spaced apart from each other along a direction Y in which bit lines BL1 to BLm extend. For example, the first to z-th memory blocks BLK1 to BLKz may be arranged to be spaced apart from each other along a second direction Y, and each of the first to z-th memory blocks may include a plurality of memory cells stacked along a third direction Z. The configuration of any one of the first to z-th memory blocks BLK1 to BLKz will be described in detail below with reference to FIGS. 4 and 5.

Figure 4:
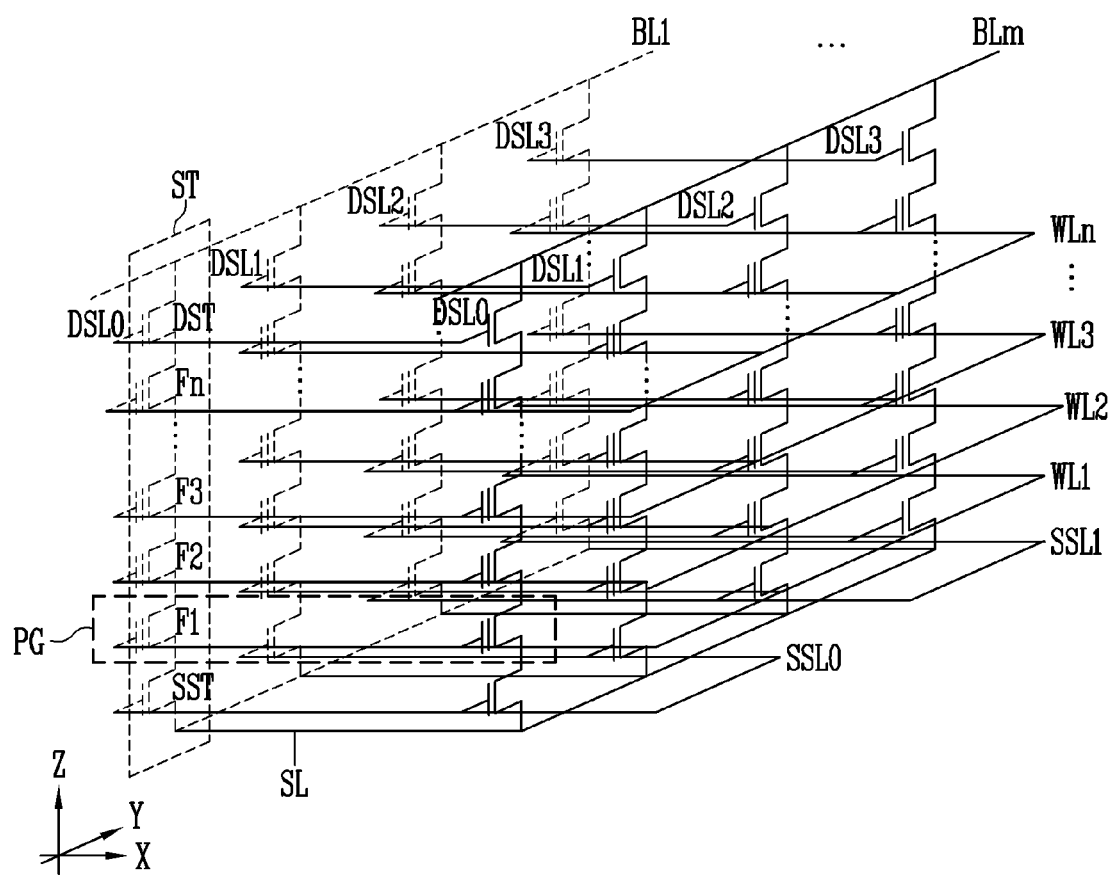
FIG. 4 is a circuit diagram illustrating in detail any one memory block illustrated in FIG. 3.

FIG. 4 is a circuit diagram illustrating in detail any one memory block illustrated in FIG. 3.

Figure 5:
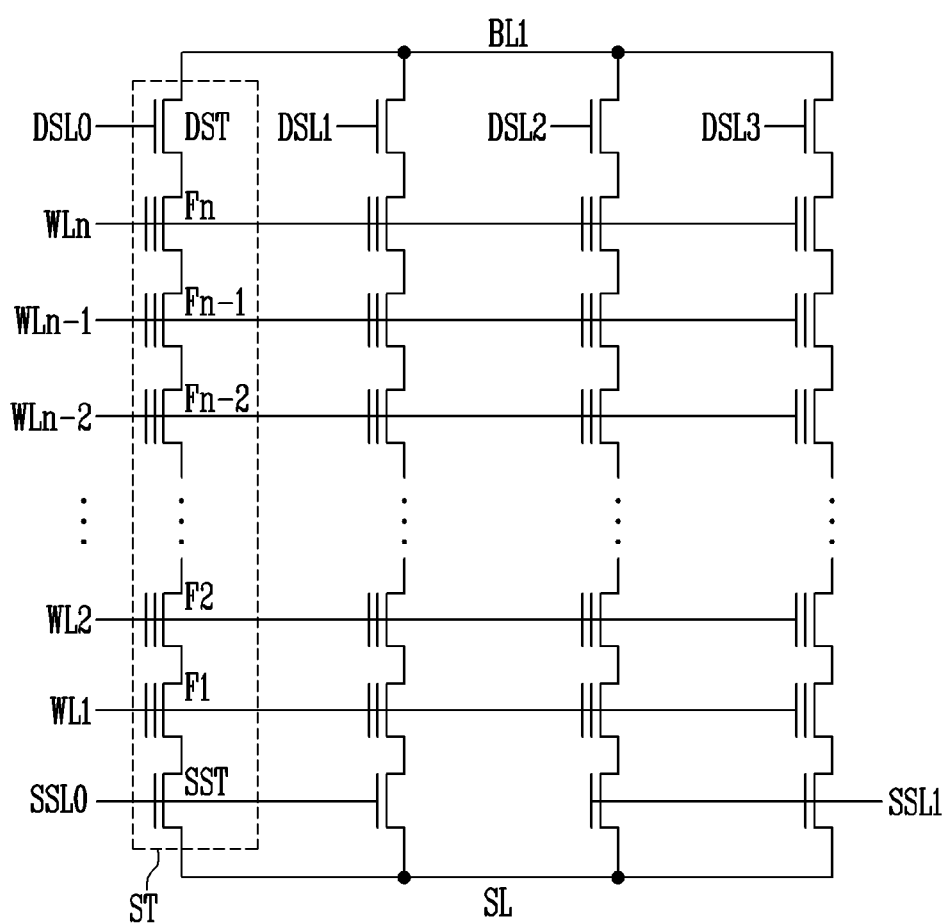
FIG. 5 is a circuit diagram illustrating memory strings illustrated in FIG. 4.

FIG. 5 is a circuit diagram illustrating memory strings illustrated in FIG. 4.

Referring to FIGS. 4 and 5, respective memory strings ST may be coupled between bit lines BL1 to BLm and a source line SL. A memory string ST coupled between the first bit line BL1 and the source line SL is described by way of example.

The memory string ST may include a source select transistor SST, memory cells F1 to Fn (where n is a positive integer), and a drain select transistor DST which are coupled in series between the source line SL and the first bit line BL1. Gates of source select transistors SST included in different memory strings ST coupled to different bit lines BL1 to BLm may be coupled to a first source select line SSL0 and to a second source select line SSL1. For example, among the source select transistors SST, source select transistors that are adjacent to each other in a second direction Y may be coupled to the same source select line. For example, assuming that the source select transistors SST are sequentially arranged along the second direction Y, the gates of the source select transistors SST which are arranged from the first source select transistor SST in a first direction X and which are included in different memory strings ST, and the gates of source select transistors SST which are arranged from the second source select transistor SST in the first direction X and which are included in different memory strings ST may be coupled to the first source select line SSL0. Also, the gates of the source select transistors SST which are arranged from the third source select transistor SST in the first direction X and which are included in different memory strings ST, and the gates of source select transistors SST which are arranged from the fourth source select transistor SST in the first direction X and which are included in different memory strings ST may be coupled to the second source select line SSL1.

The gates of the memory cells F1 to Fn may be coupled to the word lines WL1 to WLn, and the gates of the drain select transistors DST may be coupled to any one of the first to fourth drain select lines DSL0 to DSL3.

The gates of the transistors arranged in the first direction X, among the drain select transistors DST, may be coupled in common to the same drain select line (e.g., DSL0), but the gates of the transistors arranged in the second direction Y may be coupled to different drain select lines DSL1 to DSL3. For example, assuming that drain select transistors DST are sequentially arranged along the second direction Y, the gates of the drain select transistors DST which are arranged from the first drain select transistor DST in the first direction X and which are included in different memory strings ST may be coupled to the first drain select line DSL0. The drain select transistors DST, arranged from the drain select transistors DST coupled to the first drain select line DSL0 in the second direction Y, may be sequentially coupled to the second to fourth drain select lines DSL1 to DSL3. Therefore, in the selected memory block, memory strings ST coupled to the selected drain select line may be selected, and memory strings ST coupled to the remaining drain select lines, that is, unselected drain select lines, may be unselected.

The memory cells coupled to the same word line may form one page PG. Here, the term "page" means a physical page. For example, among the memory strings ST coupled to the first bit line BL1 to the m-th bit line BLm, a group of memory cells coupled in the first direction X in the same word line is referred to as a page PG. For example, among the first memory cells F1 coupled to the first word line WL1, memory cells arranged in the first direction X may form one page PG. Among the first memory cells F1 coupled in common to the first word line WL1, memory cells arranged in the second direction Y may be divided into different pages. Therefore, when the first drain select line DSL0 is a selected drain select line and the first word line WL1 is a selected word line, a page coupled to the first drain select line DSL0, among a plurality of pages PG coupled to the first word line WL1, may be the selected page. The pages which are coupled in common to the word line WL1, but are coupled to unselected second to fourth drain select lines DSL1 to DSL3 may be unselected pages.

Although, in the drawings, one source select transistor SST and one drain select transistor DST are illustrated as being included in one memory string ST, a plurality of source select transistors SST and a plurality of drain select transistors DST may be included in one memory string ST depending on the memory device. Also, dummy cells may be included between the source select transistor SST, the memory cells F1 to Fn, and the drain select transistor DST depending on the memory device. The dummy cells do not store user data like the normal memory cells F1 to Fn, but may be used to improve the electrical characteristics of each memory string ST. However, since the dummy cells are not essential components in the present embodiment, a detailed description thereof will be omitted here.

Figure 6:
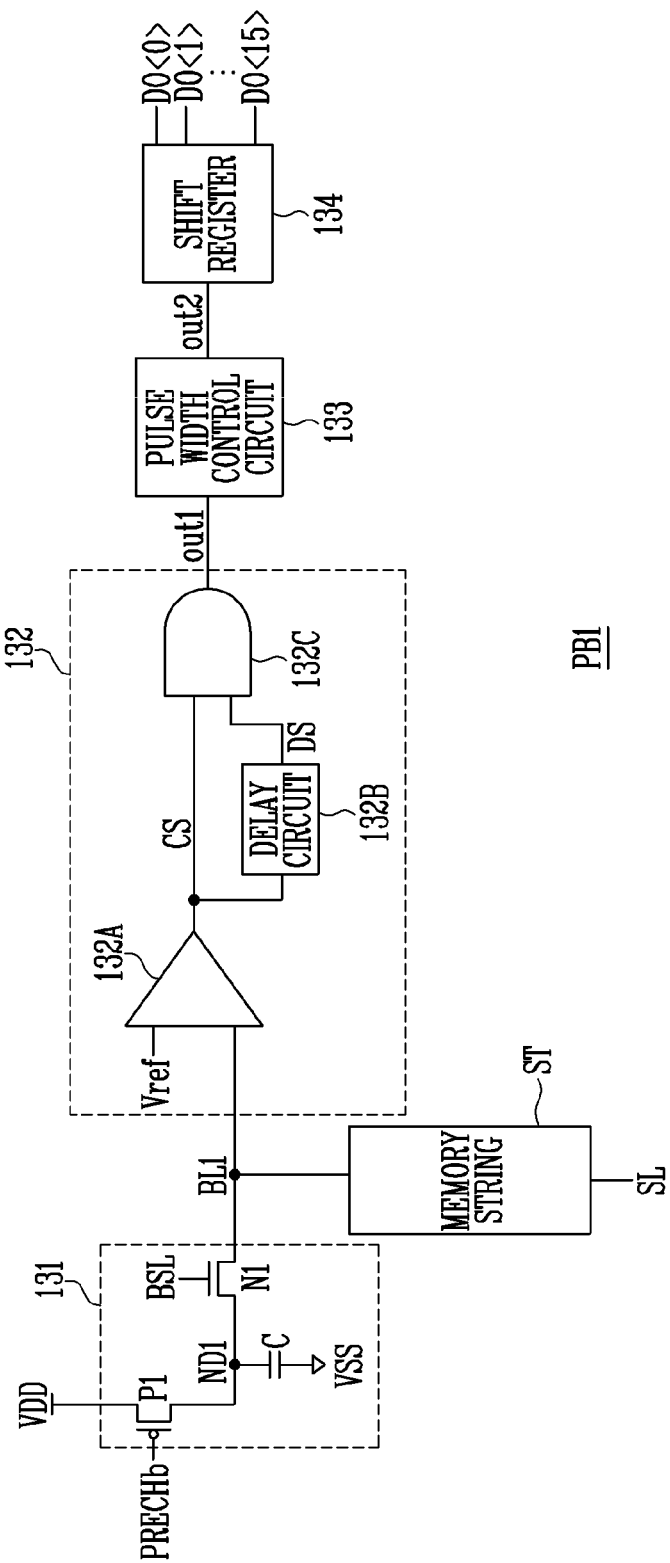
FIG. 6 is a diagram illustrating a page buffer of FIG. 2.

FIG. 6 is a diagram illustrating the page buffer of FIG. 2.

The plurality of page buffers PB1 to PBm illustrated in FIG. 2 may be configured to be similar to each other. In FIG. 6, the page buffer PB1, among the plurality of page buffers PB1 to PBm of FIG. 2, is illustrated.

The page buffer PB1 may include a precharger 131, a comparison signal output circuit 132, a pulse width control circuit 133, and a shift register 134.

The precharger 131 may be coupled between a source of a supply voltage VDD and a bit line BL1, and may precharge the bit line BL1 to a precharge level during a read operation or a verify operation.

The precharger 131 may include a PMOS transistor P1, a capacitor C, and an NMOS transistor N1. The PMOS transistor P1 may be coupled between the source of the supply voltage VDD and a node ND, and may apply the supply voltage VDD to the node ND in response to a precharge signal PRECHb. The capacitor C may be coupled between the node ND and a source of a ground voltage VSS to prevent the potential level of the node ND from rapidly changing. The NMOS transistor N1 may be coupled between the node ND and the bit line BL1, and may apply the supply voltage VDD, provided through the node ND, to the bit line BL1 in response to a bit line select signal BSL.

For example, the precharger 131 may precharge the bit line BL1 to a precharge level (e.g., VDD-Vth (threshold voltage of N1)) in response to the precharge signal PRECHb having a logic low level and the bit line select signal BSL having a logic high level during a precharge operation period of the read operation or the verify operation. When the precharge operation period is terminated, the precharger 131 may be deactivated, thus interrupting the application of the supply voltage VDD to the bit line During a sensing operation period after the precharge operation period, the comparison signal output circuit 132 may generate a first output signal out1 by comparing the voltage of the bit line BL1 with a reference voltage Vref. The comparison signal output circuit 132 may generate the first output signal out1 having a pulse width that varies depending on the discharge slope of the voltage of the bit line BL1. That is, the pulse width of the first output signal out1 may vary depending on the discharge slope of the voltage of the bit line BL1. For example, when the discharge slope of the voltage of the bit line BL1 is larger, the pulse width of the first output signal out1 may be smaller, whereas when the discharge slope of the voltage of the bit line BL1 is smaller, the pulse width of the first output signal out1 may be larger.

The comparison signal output circuit 132 may include a comparator 132A, a delay circuit 132B, and an output signal generation circuit 132C.

The comparator 132A may generate and output a comparison signal CS by comparing the potential of the bit line BL1 with the potential of the reference voltage Vref. For example, when the potential of the bit line BL1 is higher than that of the reference voltage Vref, the comparator 132A may generate and output a comparison signal CS having a logic high level, whereas when the potential of the bit line BL1 is gradually discharged and becomes lower than or equal to that of the reference voltage Vref, the comparator 132A may generate and output a comparison signal CS having a logic low level.

The delay circuit 132B may generate and output a delayed signal DS by delaying the comparison signal CS for a preset time.

The output signal generation circuit 132C may generate and output the first output signal out1 by logically combining the comparison signal CS with the delayed signal DS. The output signal generation circuit 132C may be implemented as an AND gate. By performing an AND operation on the delayed signal DS and the comparison signal CS, the output signal generation circuit 132C may eliminate any oscillations that may occur in the comparison signal CS when the potential of the bit line BL1 is very close to the reference voltage Vref, such as may be caused, for example, by noise.

The pulse width control circuit 133 may receive the first output signal out1, and may generate a second output signal out2 by increasing the pulse width of the first output signal out1 by a preset multiple. For example, the pulse width control circuit 133 may receive the first output signal out1, and may then generate and output the second output signal out2 having a pulse width that is twice that of the first output signal out1.

The shift register 134 may receive the second output signal out2, and may then output pieces of data D0<15:0>corresponding to the pulse width of the second output signal out2. For example, the shift register 134 may activate any one of the pieces of data D0<15:0>to a logic high level based on the pulse width of the second output signal out2, and may output the activated data. In an illustrative example of an implementation the shift register 134 may operate by setting a first bit DO<0>of the data DO<15:0>to 1 in response to the second output signal out2 changing from 0 to 1, and then shifting the bits of the data D0<15:0>by one each cycle of a clock signal until the second output signal out2 changes back to 0. Note that while the illustrated embodiment outputs a set of sixteen "one hot" coded bits in data D0<15:0>to indicate the pulse width, embodiments are not limited thereto; for example, in another embodiment, a binary-coded count corresponding to the pulse width could be produced instead of or in addition to the data D0<15:0>.

Figure 7:
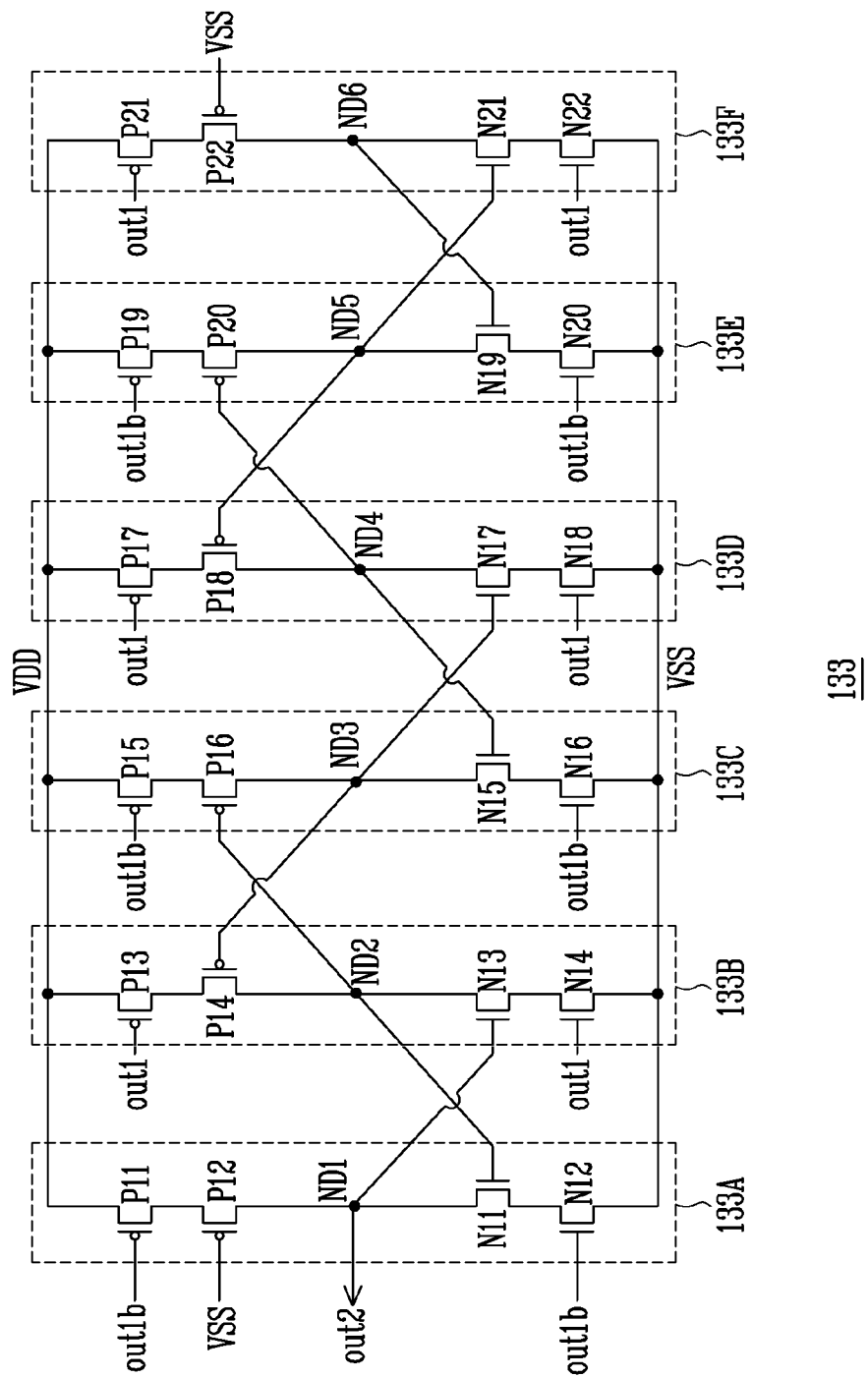
FIG. 7 is a diagram illustrating an embodiment of a pulse width control circuit of FIG. 6.

FIG. 7 is a diagram illustrating an embodiment of the pulse width control circuit of FIG. 6.

Referring to FIG. 7, the pulse width control circuit 133 may be implemented in a manner similar to an inverter chain circuit. The pulse width control circuit 133 may include a plurality of split-enable inverters 133A to 133F coupled in series to each other. The split-enable inverters 133A to 133F differ from conventional inverters in that the pull-down and pull-up portions of each are separately enabled by respective signals.

The split-enable inverter 133A may include PMOS transistors P11 and P12 and NMOS transistors N11 and N12 coupled in series to each other between a source of a supply voltage VDD and a source of a ground voltage VSS. The PMOS transistors P11 and P12 may be coupled in series between the source of the supply voltage VDD and an internal node ND1, wherein an inverted output signal out1*b*, which is an inverted signal of a first output signal out1, is input to a gate of the PMOS transistor P11 and the ground voltage VSS is input to a gate of the PMOS transistor P12. The NMOS transistors N11 and N12 may be coupled in series between the internal node ND1 and the source of the ground voltage VSS, wherein a gate of the NMOS transistor N11 is coupled to the internal node ND2 of the adjacent split-enable inverter 133B and the inverted output signal out1*b* is input to a gate of the NMOS transistor N12. The internal node ND1 may be an output node which outputs a second output signal out2.

The split-enable inverter 133B may include PMOS transistors P13 and P14 and NMOS transistors N13 and N14 coupled in series to each other between the source of the supply voltage VDD and the source of the ground voltage VSS. The PMOS transistors P13 and P14 may be coupled in series between the source of the supply voltage VDD and the internal node ND2, wherein the first output signal out1 is input to a gate of the PMOS transistor P13 and a gate of the PMOS transistor P14 is coupled to the internal node ND3 of the adjacent split-enable inverter 133C. The NMOS transistors N13 and N14 may be coupled in series between the internal node ND2 and the source of the ground voltage VSS, wherein a gate of the NMOS transistor N13 is coupled to the internal node ND1 of the adjacent split-enable inverter 133A and the first output signal out1 is input to a gate of the NMOS transistor N14.

The split-enable inverter 133C may include PMOS transistors P15 and P16 and NMOS transistors N15 and N16 coupled in series to each other between the source of the supply voltage VDD and the source of the ground voltage VSS. The PMOS transistors P15 and P16 may be coupled in series between the source of the supply voltage VDD and the internal node ND3, wherein the inverted output signal out1*b* is input to a gate of the PMOS transistor P15 and a gate of the PMOS transistor P16 is coupled to the internal node ND2 of the adjacent split-enable inverter 133B. The NMOS transistors N15 and N16 may be coupled in series between the internal node ND3 and the source of the ground voltage VSS, wherein a gate of the NMOS transistor N15 is coupled to the internal node ND4 of the adjacent split-enable inverter 133D and the inverted output signal out1*b* is input to a gate of the NMOS transistor N16.

The split-enable inverter 133D may include PMOS transistors P17 and P18 and NMOS transistors N17 and N18 coupled in series to each other between the source of the supply voltage VDD and the source of the ground voltage VSS. The PMOS transistors P17 and P18 may be coupled in series between the source of the supply voltage VDD and the internal node ND4, wherein the first output signal out1 is input to a gate of the PMOS transistor P17 and a gate of the PMOS transistor P18 is coupled to the internal node ND5 of the adjacent split-enable inverter 133E. The NMOS transistors N17 and N18 may be coupled in series between the internal node ND4 and the source of the ground voltage VSS, wherein a gate of the NMOS transistor N17 is coupled to the internal node ND3 of the adjacent split-enable inverter 133C and the first output signal out1 is input to a gate of the NMOS transistor N18.

The split-enable inverter 133E may include PMOS transistors P19 and P20 and NMOS transistors N19 and N20 coupled in series to each other between the source of the supply voltage VDD and the source of the ground voltage VSS. The PMOS transistors P19 and P20 may be coupled in series between the source of the supply voltage VDD and the internal node ND5, wherein the inverted output signal out1*b* is input to a gate of the PMOS transistor P19 and a gate of the PMOS transistor P20 is coupled to the internal node ND4 of the adjacent split-enable inverter 133D. The NMOS transistors N19 and N20 may be coupled in series between the internal node ND5 and the source of the ground voltage VSS, wherein a gate of the NMOS transistor N19 is coupled to the internal node ND6 of the adjacent split-enable inverter 133F and the inverted output signal out1*b* is input to a gate of the NMOS transistor N20.

The split-enable inverter 133F may include PMOS transistors P21 and P22 and NMOS transistors N21 and N22 coupled in series to each other between the source of the supply voltage VDD and the source of the ground voltage VSS. The PMOS transistors P21 and P22 may be coupled in series between the source of the supply voltage VDD and the internal node ND6, wherein the first output signal out1 is input to a gate of the PMOS transistor P21 and the ground voltage VSS is input to a gate of the PMOS transistor P22. The NMOS transistors N21 and N22 may be coupled in series between the internal node ND6 and the source of the ground voltage VSS, wherein a gate of the NMOS transistor N21 is coupled to the internal node ND5 of the adjacent split-enable inverter 133E and the first output signal out1 is input to a gate of the NMOS transistor N22.

The pulse width control circuit 133 operates by driving the second output signal out2 to a logical 1 level (here, VDD) when the first output signal out1 has the logical 1 level. The output signal out1 being 1 causes the inverted output signal out1b to have the logic 0 level (here, VSS), which turns on PMOS transistor P11. Because PMOS transistor P12 is always on, this causes the split-enable inverter 133A to drive the second output signal out2 to the logical 1 level.

When the first output signal out1 goes to zero, the PMOS transistor P11 turns off and the NMOS transistor N12 turns on. However, the split-enable inverter 133A does not drive the second output signal out2 to a logical 1 level until the NMOS transistor N11 turns on as well. As a result, the second output signal out2 remains at the logic 1 level until the output of the split-enable inverter 133B goes high.

Because of the way that the split-enable inverters 133A through 133F are coupled to each other, the amount of time between the first output signal out1 going to the logic 0 level and the output of the split-enable inverter 133B going high depends on how long the first output signal out1 was at the logic 1 level; that is, on the pulse width of the first output signal out1. In the embodiment shown, the amount of time between the first output signal out1 going to the logic 0 level and the output of the split-enable inverter 133B going high is one inverter-delay less than the pulse width of the first output signal out1. As a result, in the embodiment of FIG. 7, the second output signal out2 remains at the logic 1 plevel for a duration equal to the width of the just-ended pulse on the first output signal out1 and is then driven to the logic 0 level.

In this manner, the pulse width control circuit 133 produces the second output signal out2 having a pulse with a pulse width twice that of a corresponding pulse on the first output signal out1. The number of split-enable inverters 133x and the delay introduced by each of the split-enable inverters 133x determines the maximum pulse width that can be doubled by the pulse width control circuit 133, and accordingly the number of split-enable inverters 133x may vary according to the requirements of the particular embodiment.

Figure 8:
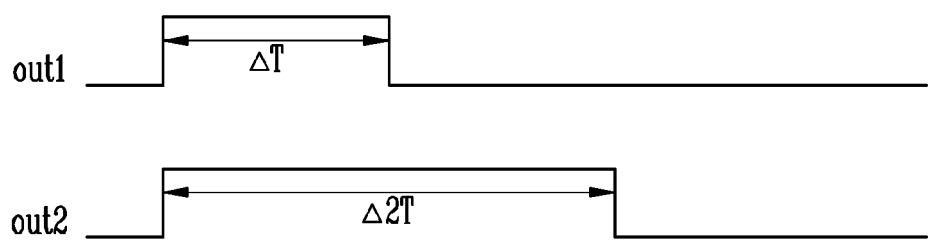
FIG. 8 is a waveform diagram illustrating the output signal of the pulse width control circuit.

FIG. 8 is a waveform diagram illustrating the output signal of the pulse width control circuit.

Referring to FIGS. 7 and 8, when the first output signal out1 is input to the pulse width control circuit 133, the second output signal out2 may be generated and output in response to the first output signal out1 and the inverted output signal out1b, which is the inverted signal of the first output signal out1. Here, in the pulse width control circuit 133, a signal transition operation depending on the inversion operations by the plurality of split-enable inverters 133A to 133F may be delayed for a preset time, thus causing the pulse width Δ2T of the second output signal out2 to be greater than the pulse width ΔT of the first output signal out1. For example, the pulse width Δ2T of the second output signal out2 may be twice the pulse width ΔT of the first output signal out1.

Although, in FIG. 7, the embodiment in which six split-enable inverters form a chain circuit is illustrated and described, the present disclosure is not limited thereto, and the maximum additional pulse width (relative to the width of a pulse on the first output signal out1) of the second output signal out2 that is output from the chain circuit may be controlled by adjusting the number of split-enable inverters that are coupled in a chain.

Figure 9:
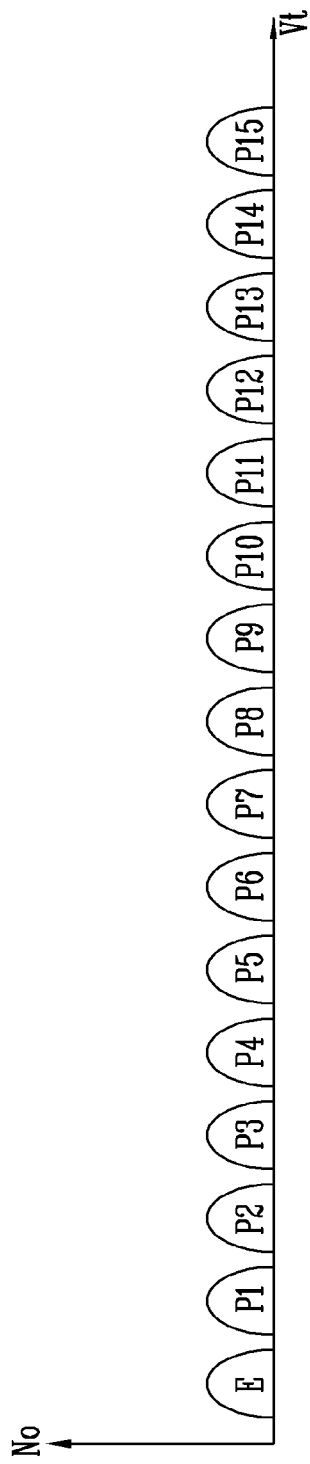
FIG. 9 is a diagram illustrating threshold voltage distributions corresponding to a plurality of states.

FIG. 9 is a diagram illustrating threshold voltage distributions corresponding to a plurality of states of a memory cell, the plurality of states including an erased state E and a plurality of program states P1 to P15.

Referring to FIG. 9, a quadruple-level cell (QLC) may be programmed to any one of the plurality of states, wherein the erased state E and the plurality of program states P1 to P15 may have different threshold voltage distributions. For example, the erased state E may have the lowest threshold voltage distribution, and the plurality of program states P1 to P15 may have threshold voltage distributions higher than that of the erased state E, and may correspond to respective threshold voltage distributions, which sequentially increase, in one-to-one correspondence.

Figure 10:
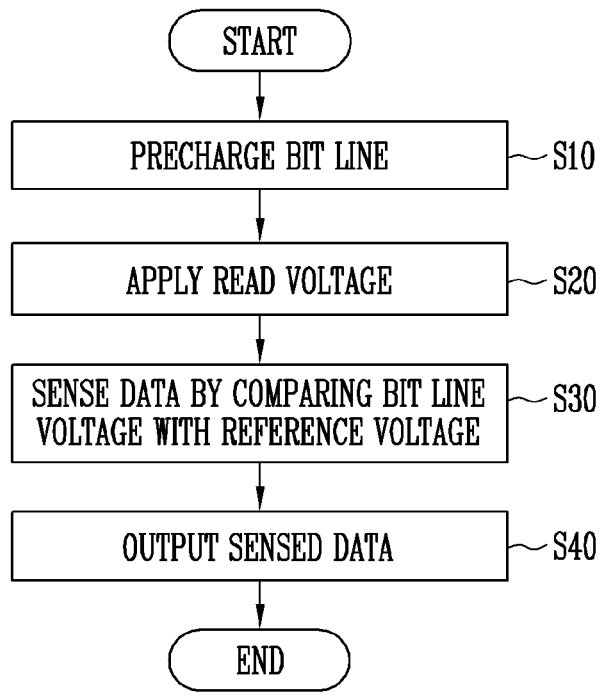
FIG. 10 is a flowchart illustrating a read operation of a memory device according to the present disclosure.

FIG. 10 is a flowchart illustrating a read operation of a memory device according to the present disclosure.

Figure 11:
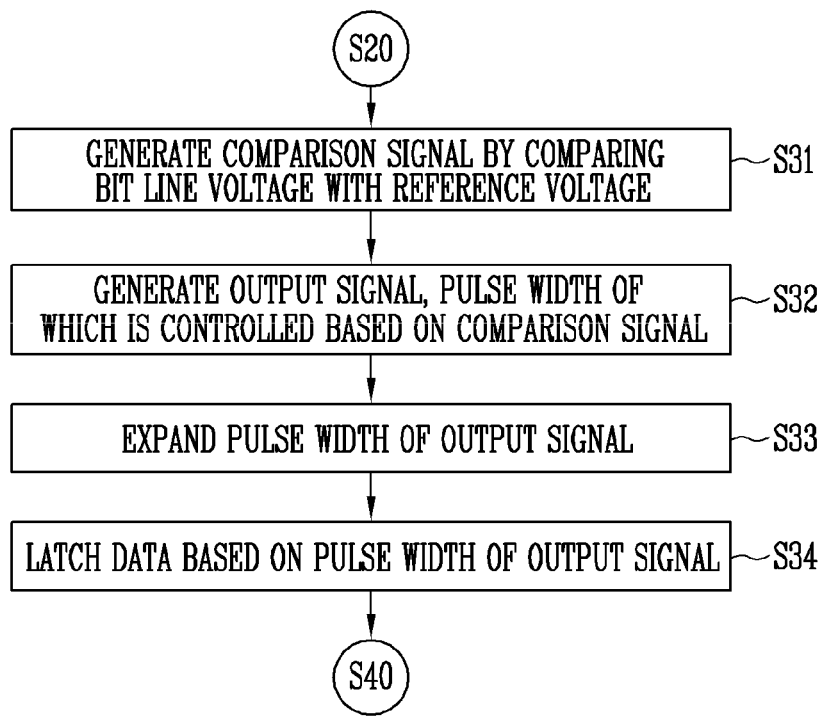
FIG. 11 is a flowchart illustrating in detail step S30 of FIG. 10.

FIG. 11 is a flowchart illustrating in detail step S30 of FIG. 10.

Figure 12:
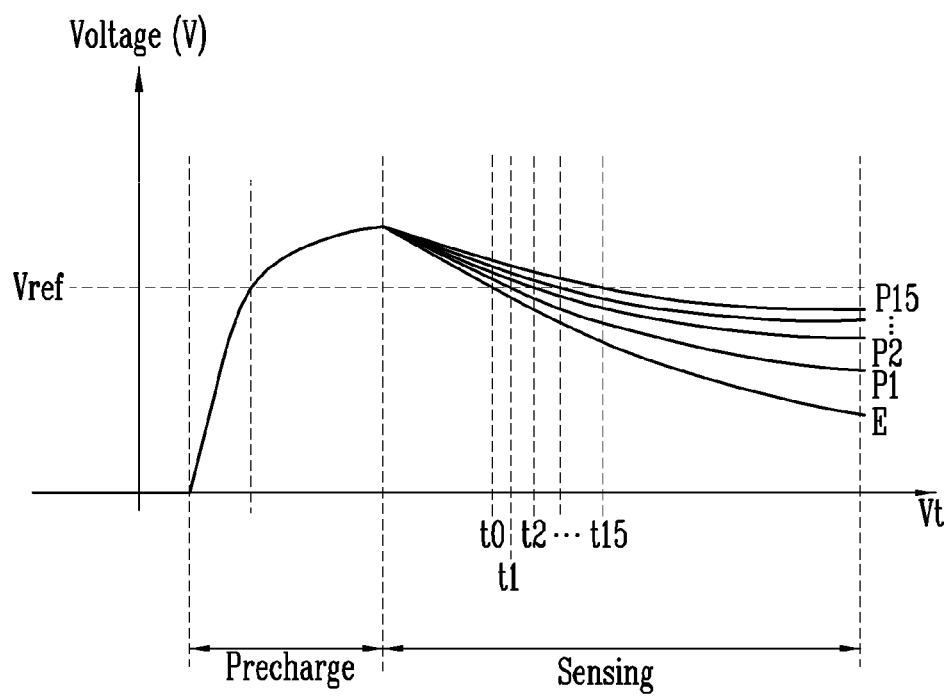
FIG. 12 is a graph illustrating an operation of comparing a bit line voltage with a reference voltage.

FIG. 12 is a graph illustrating an operation of comparing a bit line voltage with a reference voltage.

Figure 13:
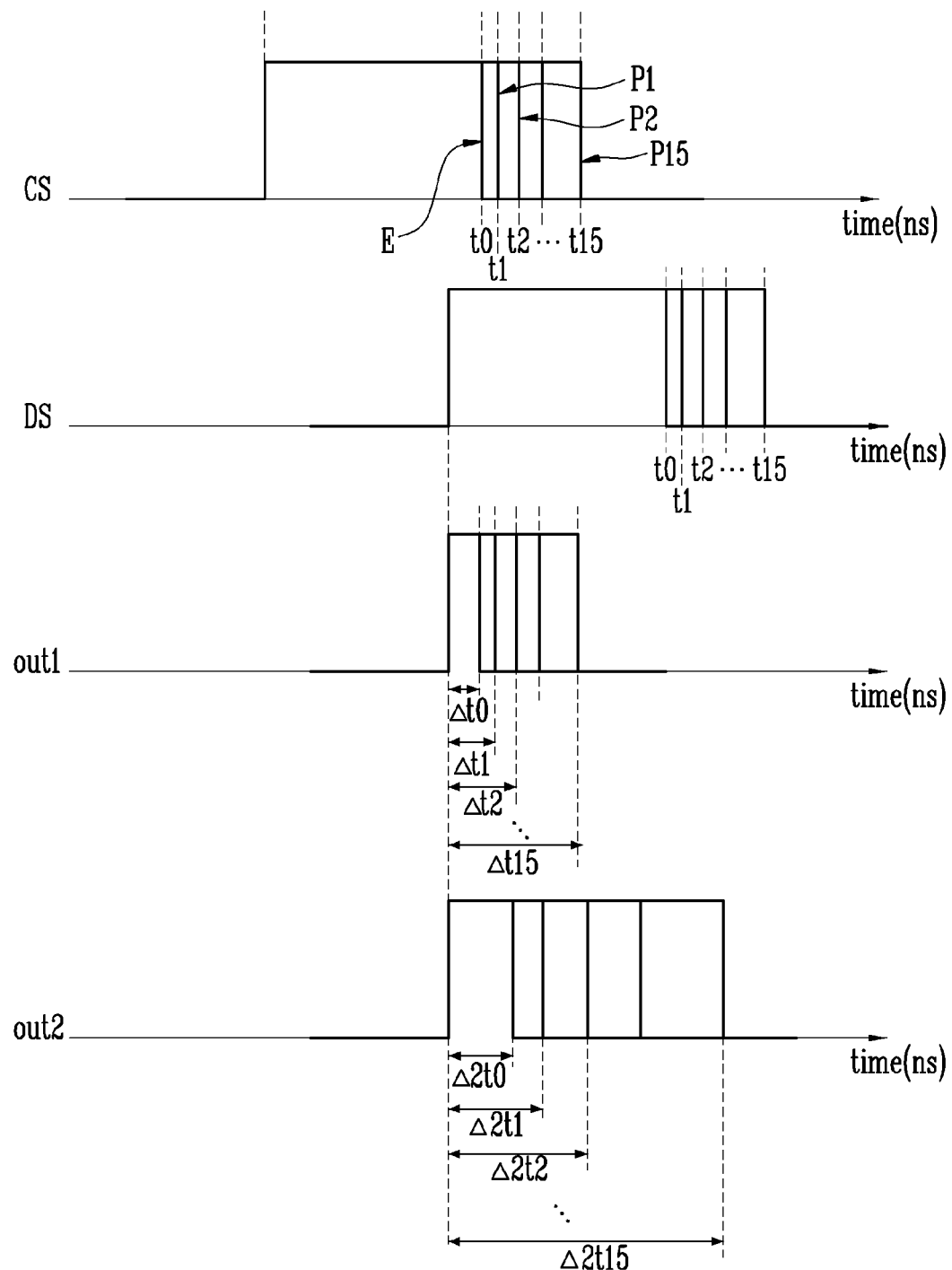
FIG. 13 is a waveform diagram for signals used to explain the operation of the page buffer of FIG. 6.

FIG. 13 is a waveform diagram for signals used to explain the operation of the page buffer of FIG. 6.

A method of performing the read operation of the memory device according to the embodiment of the present disclosure will be described with reference to FIGS. 2 to 13.

At step S10 shown in FIG. 10, a bit line precharge operation may be performed. The page buffers PB1 to PBm of the read and write circuit 130 may precharge corresponding bit lines BL1 to BLm to certain levels. For example, the precharger 131 of the page buffer PB1 may precharge the corresponding bit line BL1 to a precharge level higher than the reference voltage Vref during a precharge period.

At step S20, a read voltage apply operation may be performed. The voltage generation circuit 150 may generate a read voltage Vread and a pass voltage Vpass under the control of voltage generation circuit control signals VG_signals output from the control logic 140, and may output the generated voltages to the address decoder 120. The address decoder 120 may apply the read voltage Vread generated by the voltage generation circuit 150 to a selected word line (e.g., WL1) of a selected memory block (e.g., BLK1). The address decoder 120 may apply the pass voltage Vpass generated by the voltage generation circuit 150 to unselected word lines (e.g., WL2 to WLn) of the selected memory block (e.g., BLK1). The read voltage Vread may be a voltage higher than a threshold voltage corresponding to the program state P15 having the highest threshold voltage distribution, among the plurality of program states P1 to P15 illustrated in FIG. 9.

When the read voltage Vread is applied to the selected word line (e.g., WL1), the potential levels of the bit lines BL1 to BLm coupled to memory cells that are coupled to the selected word line may be discharged, as illustrated in FIG. 12, depending on the program states and/or erase states of the coupled memory cells. That is, during a sensing operation period, the potential levels of the bit lines BL1 to BLm may gradually decrease over time at respective rates determined by erase states and/or program states of cells respective coupled to the bit lines BL1 to BLm and collectively coupled to the selected word line.

At step S30, the page buffers PB1 to PBm may sense data by comparing the voltages of the bit lines BL1 to BLm with a reference voltage.

This operation will be described in detail below based on the page buffer PB1 by way of example, with reference to FIG. 11.

At step S31, the comparison signal output circuit 132 of the page buffer PB1 generates a comparison signal CS by comparing the voltage of the bit line BL1 with the reference voltage Vref. For example, the comparator 132A may generate and output the comparison signal CS by comparing the potential of the bit line BL1 with the potential of the reference voltage Vref. For example, when the potential of the bit line BL1 is higher than that of the reference voltage Vref, the comparator 132A may generate and output the comparison signal CS having a logic high level, whereas when the potential of the bit line BL1 is gradually discharged and becomes lower than or equal to that of the reference voltage Vref, the comparator 132A may generate and output the comparison signal CS having a logic low level. Accordingly, when a memory cell F1 coupled to the bit line BL1 and the selected word line WL1 is in the erased state E, the comparison signal CS may make a transition to a logic low level at time t0 after the read voltage Vread was applied. When the memory cell F1 is in the program state P1, the comparison signal CS may make a transition to a logic low level at time t1 after the read voltage Vread was applied. When the memory cell F1 is in the program state P2, the comparison signal CS may make a transition to a logic low level at time t2 after the read voltage Vread was applied. When the memory cell F1 is in the program state P15, the comparison signal CS may make a transition to a logic low level at time t15 after the read voltage Vread was applied. That is, the comparison signal output circuit 132 may generate and output the comparison signal CS, the transition time of which, relative to when the read voltage Vread was applied, is determined based on the discharge slope of the bit line BL1.

At step S32, the comparison signal output circuit 132 may generate and output a first output signal out1, the pulse width of which is controlled based on the comparison signal CS. For example, the delay circuit 132B may generate and output a delayed signal DS by delaying the comparison signal CS for a preset time. The output signal generation circuit 132C may generate and output the first output signal out1 by logically combining the comparison signal CS with the delayed signal DS. Accordingly, the pulse width of the first output signal out1 may be determine based on the time point at which the potential level of the bit line BL1 becomes lower than or equal to the potential level of the reference voltage Vref.

At step S33, the pulse width control circuit 133 may expand the pulse width of the first output signal out1. For example, the pulse width control circuit 133 may generate a second output signal out2 by increasing the pulse width of the first output signal out1 by a preset multiple. For example, the pulse width control circuit 133 may receive the first output signal out1, and then generate and output the second output signal out2 having a pulse width that is twice that of a corresponding pulse on the first output signal out1. For example, the pulse width control circuit 133 may receive the first output signal out1 having a pulse width Δt0 corresponding to the erased state E, and may then generate and output the second output signal out2 having a pulse width Δ2t0 (i.e., two times Δt0). For example, the pulse width control circuit 133 may receive the first output signal out1 having a pulse width Δt1 corresponding to the program state P1, and may then generate and output the second output signal out2 having a pulse width Δ2t1. For example, the pulse width control circuit 133 may receive the first output signal out1 having a pulse width Δt2 corresponding to the program state P2, and may then generate and output the second output signal out2 having a pulse width Δ2t2. For example, the pulse width control circuit 133 may receive the first output signal out1 having a pulse width Δt15 corresponding to the program state P15, and may then generate and output the second output signal out2 having a pulse width Δ2t15.

That is, the differences between the pulse widths of the first output signal out1 corresponding to the erased state E and the plurality of program states P1 to P15 may be increased.

At step S34, the shift register 134 may receive the second output signal out2, and may then latch data corresponding to the pulse width of the received second output signal out2. That is, based on the pulse width of the received second output signal out2, the data corresponding to the erased state E and the plurality of program states P1 to P15 may be latched.

At step S40, the page buffers PB1 to PBm may output the sensed data. For example, the shift register 134 of the page buffer PB1 may activate any one of pieces of data D0<15:0>to a logic high level depending on the sensed data, and may output the activated data.

As described above, in accordance with embodiments of the present disclosure, the discharge slope of a bit line coupled to memory cells may be detected and a comparison signal may be generated by comparing the discharged potential level of the bit line with the reference voltage in the state in which one read voltage is applied to a selected word line, and data may be sensed based on the pulse width of the comparison signal. Also, the accuracy of the sensing operation may be improved by amplifying the pulse width of the comparison signal.

Figure 14:
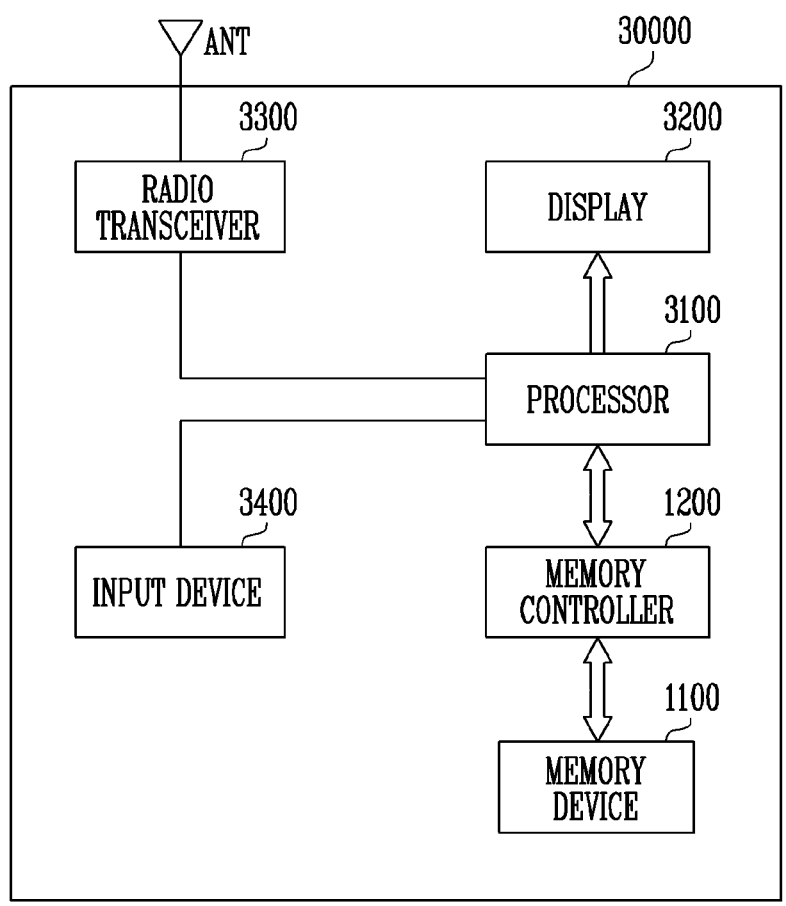
FIG. 14 is a diagram illustrating an embodiment of a memory system.

FIG. 14 is a diagram illustrating an embodiment of a memory system.

Referring to FIG. 14, a memory system 30000 may be implemented as a cellular phone, a smart phone, a tablet PC, a personal digital assistant (PDA) or a wireless communication device. The memory system 30000 may include a memory device 1100 and a memory controller 1200 that is capable of controlling the operation of the memory device 1100. The memory controller 1200 may control a data access operation of the memory device 1100, for example, a program operation, an erase operation or a read operation, under the control of a processor 3100.

Data programmed to the memory device 1100 may be output via a display 3200 under the control of the memory controller 1200.

A radio transceiver 3300 may exchange radio signals through an antenna ANT. For example, the radio transceiver 3300 may convert radio signals received through the antenna ANT into signals that may be processed by the processor 3100. Therefore, the processor 3100 may process the signals output from the radio transceiver 3300, and may transmit the processed signals to the memory controller 1200 or the display 3200. The memory controller 1200 may program the signals processed by the processor 3100 to the memory device 1100. Further, the radio transceiver 3300 may convert signals output from the processor 3100 into radio signals, and output the radio signals to an external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 so that data output from the memory controller 1200, data output from the radio transceiver 3300, or data output from the input device 3400 is output via the display 3200.

In an embodiment, the memory controller 1200 capable of controlling the operation of the memory device 1100 may be implemented as a part of the processor 3100 or as a chip provided separately from the processor 3100. Further, the memory controller 1200 may be implemented through the example of the controller 1200 illustrated in FIG. 1.

Figure 15:
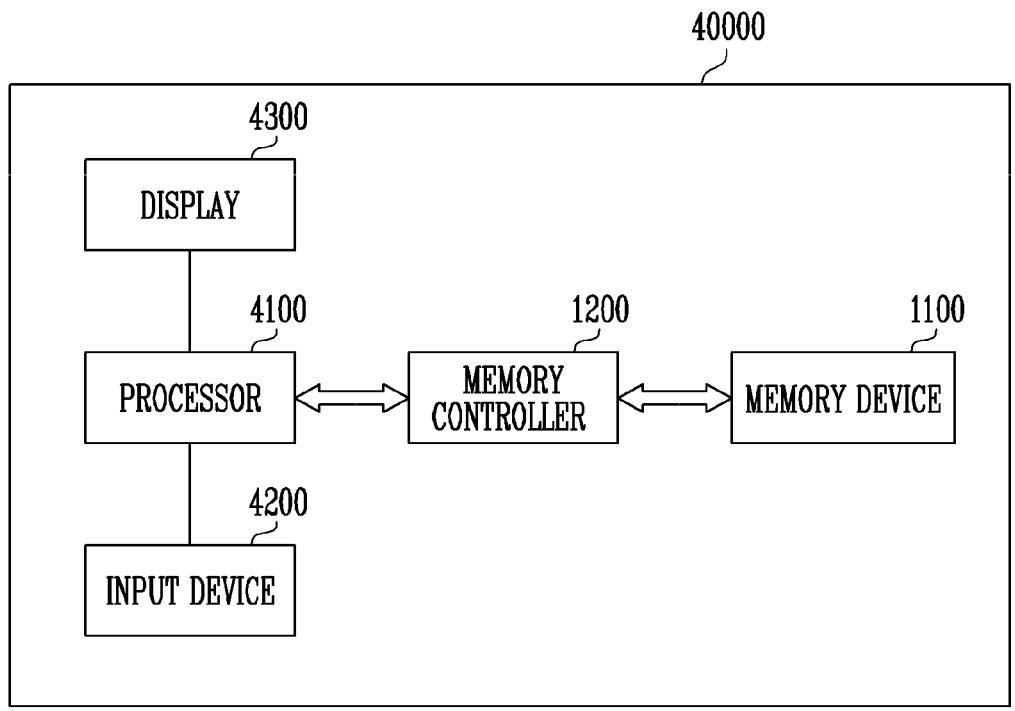
FIG. 15 is a diagram illustrating an embodiment of a memory system.

FIG. 15 is a diagram illustrating an embodiment of a memory system.

Referring to FIG. 15, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a memory device 1100 and a memory controller 1200 that is capable of controlling a data processing operation of the memory device1100.

A processor 4100 may output data, stored in the memory device 1100, via a display 4300 according to data input through an input device 4200. For example, the input device 4200 may be implemented as a pointing device such as a touch pad or a computer mouse, a keypad or a keyboard.

The processor 4100 may control the overall operation of the memory system 40000, and may control the operation of the memory controller 1200. In an embodiment, the memory controller 1200 capable of controlling the operation of the memory device 1100 may be implemented as a part of the processor 4100 or as a chip provided separately from the processor 4100. Furthermore, the memory controller 1200 may be implemented through the example of the controller 1200 illustrated in FIG. 1.

Figure 16:
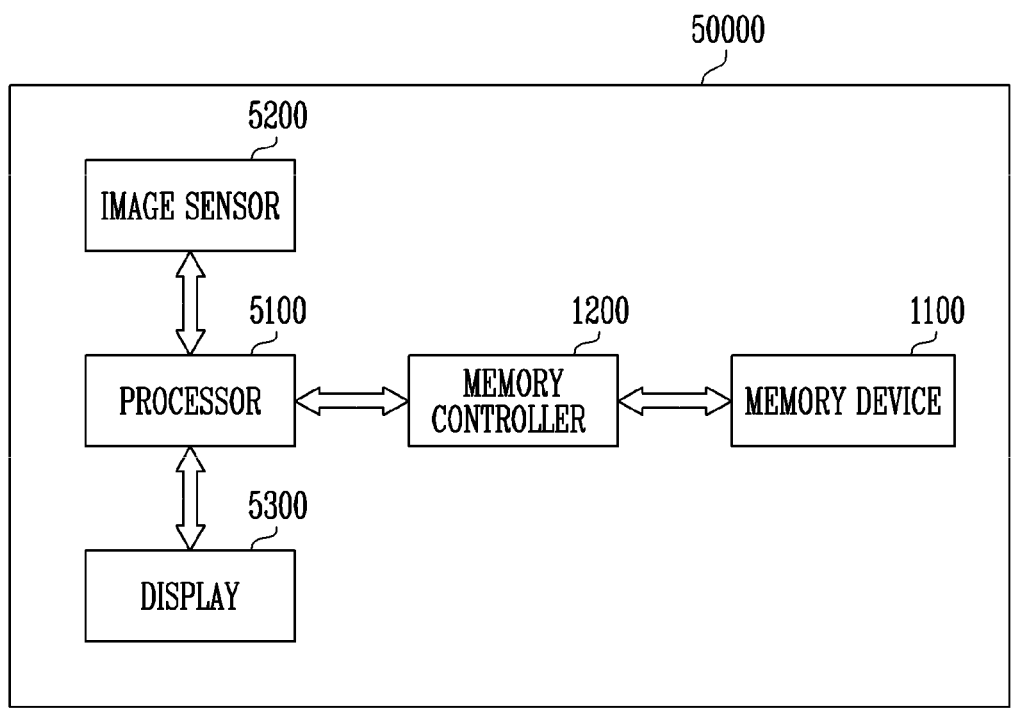
FIG. 16 is a diagram illustrating an embodiment of a memory system.

FIG. 16 is a diagram illustrating an embodiment of a memory system.

Referring to FIG. 16, a memory system 50000 may be implemented in an image processing device, for example, a digital camera, a mobile phone provided with a digital camera, a smartphone provided with a digital camera, or a tablet PC provided with a digital camera.

The memory system 50000 may include a memory device 1100 and a memory controller 1200 that is capable of controlling a data processing operation of the memory device 1100, for example, a program operation, an erase operation or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output via a display 5300 or may be stored in the memory device 1100 through the memory controller 1200. Further, data stored in the memory device 1100 may be output via the display 5300 under the control of the processor 5100 or the memory controller 1200.

In an embodiment, the memory controller 1200 capable of controlling the operation of the memory device 1100 may be implemented as a part of the processor 5100 or as a chip provided separately from the processor 5100. Furthermore, the memory controller 1200 may be implemented through the example of the controller 1200 illustrated in FIG. 1.

Figure 17:
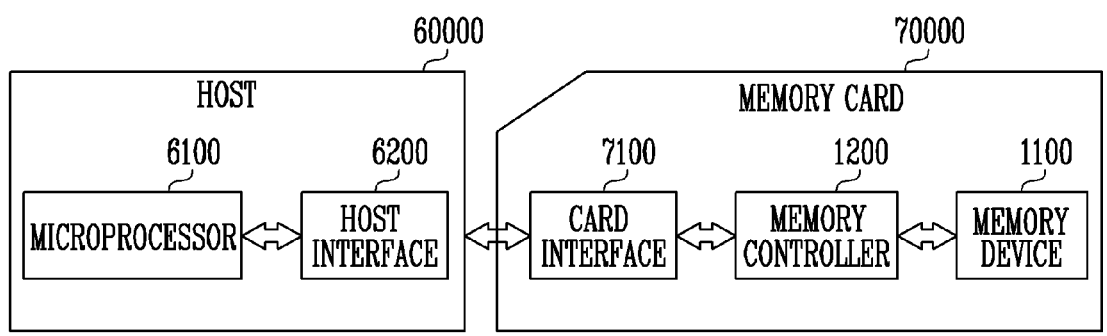
FIG. 17 is a diagram illustrating an embodiment of a memory system.

FIG. 17 is a diagram illustrating an embodiment of a memory system.

Referring to FIG. 17, a memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In an embodiment, the card interface 7100 may be, but is not limited to, a secure digital (SD) card interface or a multi-media card (MMC) interface. Furthermore, the memory controller 1200 may be implemented through the example of the controller 1200 illustrated in FIG. 1.

The card interface 7100 may interface data exchange between a host 60000 and the memory controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method performed by the hardware.

When the memory system 70000 is coupled to a host interface 6200 of the host 60000 such as a PC, a tablet PC, a digital camera, a digital audio player, a mobile phone, console video game hardware, or a digital set-top box, the host interface 6200 may perform data communication with the memory device 1100 through the card interface 7100 and the memory controller 1200 under the control of a microprocessor 6100.

In accordance with the present disclosure, a read operation for a plurality of states of a memory cell, the plurality of states including an erase state and a plurality of program states, may be performed by applying only one read voltage to a word line during a read operation, and thus the time required for the read operation may be reduced. That is, the read operation can distinguish which of the plurality of states the memory cell is in without needing to provide a plurality of read voltage to the memory cell.

Although the embodiments of the present disclosure have been disclosed, those skilled in the art will appreciate that various modifications, additions and substitutions are possible, without departing from the scope and spirit of the present disclosure.

What is claimed is:

1. A page buffer, comprising:
   a precharger configured to precharge a bit line to a precharge level;
   a comparison signal output circuit configured to generate a first output signal by comparing a voltage of the bit line with a reference voltage;
   a pulse width control circuit configured to generate a second output signal by increasing a pulse width of a pulse of the first output signal by a preset multiple; and
   a register configured to sense data based on a pulse width of the second output signal and output the sensed data.

2. The page buffer according to claim 1, wherein the comparison signal output circuit is configured to control the pulse width of the pulse of the first output signal based on a discharge slope of the voltage of the bit line and to output the first output signal having the controlled pulse width.

3. The page buffer according to claim 1, wherein the comparison signal output circuit comprises:

a comparator configured to generate a comparison signal having a logic level making a transition at a time at which the voltage of the bit line decreases to a level lower than or equal to the reference voltage;

a delay circuit configured to generate a delayed signal by delaying the comparison signal for a preset time; and an output signal generation circuit configured to generate the first output signal by logically combining the comparison signal with the delayed signal.

4. The page buffer according to claim 1, wherein the pulse width control circuit is implemented as a split-enable inverter chain circuit.

5. The page buffer according to claim 1, wherein the pulse width control circuit comprises a plurality of split-enable inverters coupled in series to each other.

6. A memory device, comprising:

a memory block including a plurality of memory cells, each programmed to any one of a plurality of states, the plurality of states including an erased state and a plurality of program states;

a voltage generation circuit configured to generate a read voltage to be applied to word lines of the memory block during a read operation; and a read and write circuit coupled to bit lines of the memory block, and configured to detect a time at which potentials of the bit lines become lower than or equal to a reference voltage and to sense data based on a pulse width of an output signal corresponding to the detected time during the read operation, wherein the read and write circuit comprises a plurality of page buffers coupled to the bit lines, respectively, and wherein each of the plurality of page buffers comprises:

a comparison signal output circuit configured to generate a first output signal by comparing a voltage of a corresponding one bit line with the reference voltage;

a pulse width control circuit configured to generate the output signal by expanding a pulse width of the first output signal by a preset multiple; and a register configured to sense the data based on the pulse width of the output signal and output the sensed data.

7. The memory device according to claim 6, wherein the read and write circuit is configured to sense a state that a memory cell is programmed to from among the plurality of states without supplying another read voltage different from the read voltage to the memory cell during the read operation.

8. The memory device according to claim 6, wherein, during the read operation, the plurality of memory cells are configured such that the detected time is changed based on a state from among the plurality of states that a memory cell is in when the read voltage is applied.

9. The memory device according to claim 6, wherein the read voltage is higher than a threshold voltage corresponding to a state having a highest threshold voltage distribution, among the plurality of states.

10. The memory device according to claim 6, wherein each of the plurality of page buffers further comprises a precharger configured to precharge the one bit line to a certain level.

11. The memory device according to claim 6, wherein the comparison signal output circuit is configured to control the pulse width of the first output signal based on the detected time and output the first output signal having the controlled pulse width.

12. The memory device according to claim 6, wherein the comparison signal output circuit comprises:

a comparator configured to generate a comparison signal having a logic level making a transition at a time at which the voltage of the one bit line decreases to a level lower than or equal to the reference voltage;

a delay circuit configured to generate a delayed signal by delaying the comparison signal for a preset time; and an output signal generation circuit configured to generate the first output signal by logically combining the comparison signal with the delayed signal.

13. The memory device according to claim 6, wherein the pulse width control circuit is implemented as a split-enable inverter chain circuit.

14. The memory device according to claim 6, wherein the pulse width control circuit comprises a plurality of split-enable inverters coupled in series to each other.

15. A method of operating a memory device, comprising:

applying one read voltage having a certain potential level to a selected word line coupled in common to one or more memory cells;

detecting a discharge slope by comparing voltages of respective bit lines coupled to the one or more memory cells with a reference voltage;

generating an output signal, a pulse width of which is controlled based on the discharge slope; and sensing data based on the pulse width of the output signal.

16. The method according to claim 15, further comprising:

precharging the bit lines to a preset level before applying the read voltage.

17. The method according to claim 15, wherein detecting the discharge slope comprises:

comparing the voltages of the bit lines with the reference voltage and generating a comparison signal making a transition at a time point at which the voltages of the bit lines become lower than or equal to the reference voltage.

18. The method according to claim 17, wherein generating the output signal comprises:

generating a delayed signal by delaying the comparison signal for a preset time; and generating the output signal, the pulse width of which is controlled depending on the discharge slope by logically combining the comparison signal with the delayed signal.

19. The method according to claim 15, further comprising:

after generating the output signal, increasing the pulse width of the output signal by a preset multiple.

* * * * *